(12) United States Patent
Bird et al.

(10) Patent No.: US 6,763,572 B2
(45) Date of Patent: Jul. 20, 2004

(54) METHOD OF MANUFACTURING A COIL FOR A MAGNET

(75) Inventors: John Maurice Bird, Charlbury (GB); Alex Palkovich, Oxford (GB)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/312,404

(22) Filed: May 14, 1999

(65) Prior Publication Data

US 2002/0011912 A1 Jan. 31, 2002

(30) Foreign Application Priority Data

May 15, 1998 (GB) .............................................. 9810579

(51) Int. Cl.$^7$ ................................................ H01F 7/06
(52) U.S. Cl. ........................ 29/605; 29/602.1; 29/606; 335/216; 335/199; 264/272.19
(58) Field of Search ........................ 29/605, 607, 848, 29/856, 858, 606, 602.1, 831; 335/216, 199, 299; 336/198; 264/272.11, 272.16, 272.19; 174/254

(56) References Cited

U.S. PATENT DOCUMENTS

| | | | | |
|---|---|---|---|---|
| 3,136,034 A | * | 6/1964 | Reese et al. .................. | 29/605 |
| 3,973,321 A | * | 8/1976 | Horton ....................... | 29/602.1 |
| 4,541,171 A | * | 9/1985 | Buckley ....................... | 29/605 |
| 4,934,049 A | * | 6/1990 | Kiekhafer et al. ............. | 29/605 |
| 5,526,561 A | * | 6/1996 | McGaffigan .................. | 29/605 |
| 5,570,021 A |  | 10/1996 | Dachniwskyj et al. |  |
| 5,623,208 A |  | 4/1997 | Hasegawa |  |
| 5,635,837 A |  | 6/1997 | Bornert |  |
| 5,636,837 A |  | 6/1997 | Takemoto et al. |  |
| 5,926,945 A | * | 7/1999 | Messick et al. ............... | 29/605 |

FOREIGN PATENT DOCUMENTS

| | | | | |
|---|---|---|---|---|
| EP | 0153131 | | 8/1985 | |
| EP | 0768539 | | 4/1997 | |
| JP | 60-106114 | * | 6/1985 | ................ 29/602.1 |
| JP | 61-79214 | * | 4/1986 | ................... 29/605 |
| JP | 3-141694 | * | 6/1991 | ................... 29/831 |

OTHER PUBLICATIONS

Search Report for GB Application No. GB 9810579.4: Dated Nov. 11, 1998.
Letter dated Dec. 1, 1999 from the U.K. Patent Office.

* cited by examiner

*Primary Examiner*—A. Dexter Tugbang
(74) *Attorney, Agent, or Firm*—Renner, Otto, Boisselle & Sklar, LLP

(57) ABSTRACT

A method is provided for manufacturing a coil for a magnet. The method comprises the steps of providing a curved former, and disposing at least one hard-wire electrical conductor around the curved former. The former is initially manufactured in a flat or substantially flat shape, and is then bent into a desired curved shape. The former may be manufactured by moulding, and may be manufactured from a resilient material.

4 Claims, 3 Drawing Sheets

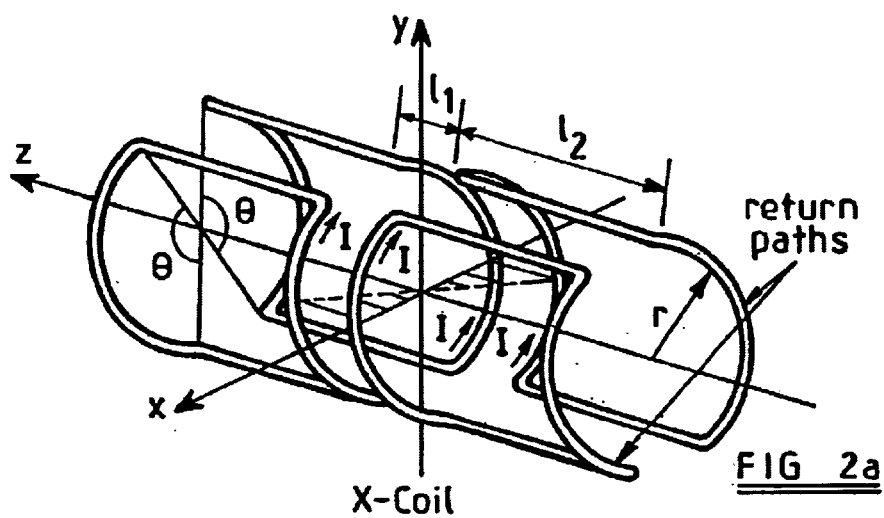
FIG 2a X-Coil
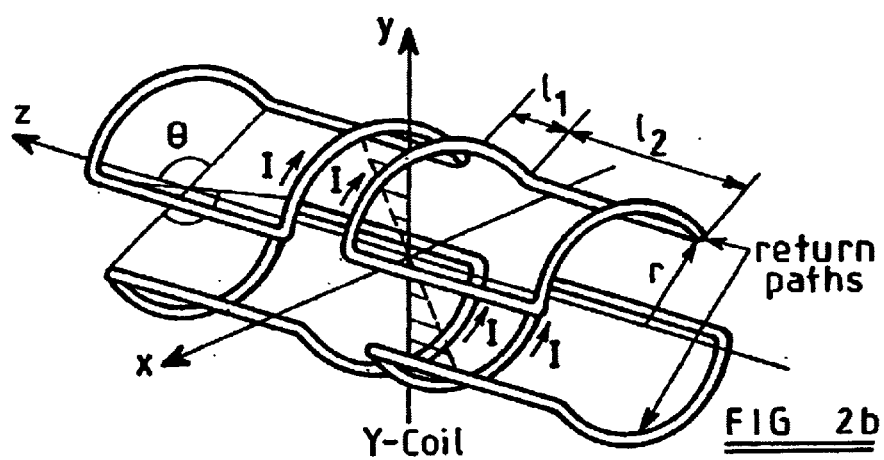
FIG 2b Y-Coil
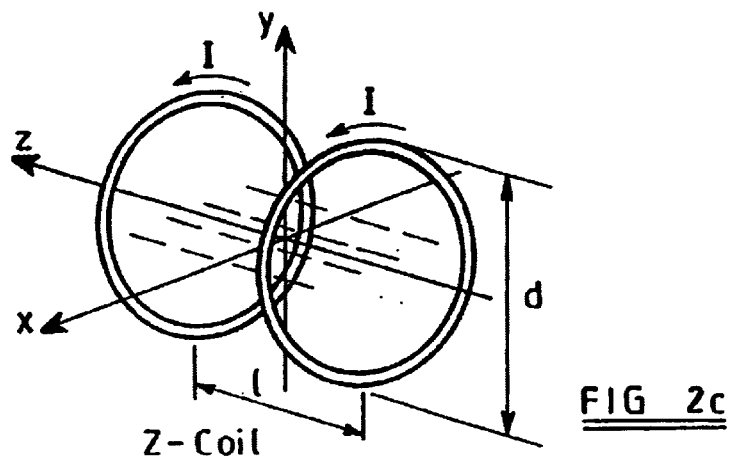
FIG 2c Z-Coil

METHOD OF MANUFACTURING A COIL FOR A MAGNET

FIELD OF THE INVENTION

This invention relates to a coil for a magnet and to a method of manufacturing a coil for a magnet. More particularly, it relates to a gradient coil and to a method of manufacturing a gradient coil and, in particular to a gradient coil for use in a magnetic resonance imaging (MRI) system.

BACKGROUND

MRI systems are used today for investigating a large variety of body parts. These systems are based on nuclear phenomena displayed by atomic nuclei having a non-zero magnetic moment (or "spin"). When such nuclei are placed in a static, uniform magnetic field, the nuclear spins are aligned by the magnetic field so as to be either aligned with or against the static magnetic field. The nuclear spins are not stationary, but precess around an axis defined by the magnetic field. The frequency at which the spins precess is known as the "Larmor frequency" $\omega_0$. The Larmor frequency is given by $$\omega_0 = \gamma B_0 \quad (1)$$

where $\gamma$ is the gyromagnetic ratio of the nucleus and $B_0$ is the applied magnetic field. For a hydrogen nucleus, $\gamma=42.57$ MHz/T.

When the nuclear spins are aligned in the static magnetic field $B_0$, it is possible to "flip" the spins by applying an alternating magnetic field $B_1$. In order to do this, the alternating magnetic field must be at 90° to the static magnetic field and it must alternate at substantially the Larmor frequency. When such an alternating field $B_1$ is applied the spins will tend to align themselves parallel to $B_1$, and when the alternating field is removed the spins will relax back into the state in which they are aligned with the static magnetic field $B_0$. The alignment of the spins with the alternating field decreases the magnetisation in the longitudinal direction (parallel to $B_0$) and increases the magnetisation in the transverse plane (that is, the plane perpendicular to $B_0$), and the subsequent relaxation of the spins when the alternating field is removed produces the reverse effects. These changes in the magnetisation are detected in the MRI process, and are processed to provide a visible display of the nuclei.

FIG. 1 at 11 shows a typical MRI system in block diagram form. The magnet 12 provides the static magnetic field $B_0$. In principle, the magnet 12 could be a superconductive magnet, an electro-magnet or a permanent magnet. However, a super-conducting magnet is commonly used, since these readily provide a large, homogeneous static magnetic field. The magnet 12 contains a bore 12 enabling the entry of a patient into the static magnetic field. A patient shown at 14 is inserted into the bore 13 using bed arrangement 16 so as to be within the static magnetic field.

Radio frequency (r.f.) pulses generated by transmitter 22 and applied through multiplexer 23 and radio frequency coil apparatus 24 act to tip the aligned spins so as to have a projection, for example, in the X, Z plane; the X, Y plane or the Y, Z plane. The X, Y and Z nomenclature refers to the imaginary orthogonal axes shown at 21 used in describing MRI systems; where the Z axis is an axis co-axial with the axis of the bore hole. The Y axis is the vertical axis extending from the center of the magnetic field and the X axis is the corresponding horizontal axis orthogonal to the other axes.

The spins when realigning after the radio frequency pulse is removed generate free induction decay (F.I.D.) signals which are received by the radio frequency coil apparatus 24 and transmitted through the multiplexer to the receiving circuit 26. From the receiving circuit the received signals go through the controller 25 to an image processor 27. The image processor works in conjunction with a display memory 28 to provide the image displayed on display monitor 29. It should be noted that the radio frequency coil apparatus 24 can comprise separate coils for transmitting and receiving or the same coil apparatus 24 could be used for both transmitting and receiving the r.f. pulses.

In order to spatially resolve the MRI signal, encoding signals within the static magnetic field are provided by gradient coils (not shown in FIG. 1). There are typically three sets of gradient coils. X gradient coils alter the strength of the static magnetic field along the X axis, Y gradient coils alter the strength of the static magnetic field along the Y axis, and Z gradient coils alter the strength of the static magnetic field along the Z axis. The strength of the static magnetic field along other axes, such as the XZ axis for example, can be changed using two or three of the gradient coils in combination.

The X, Y and Z gradient coils are driven by X gradient driver 17, Y gradient driver 18 and Z gradient driver 19, respectively. It is possible to modify the static magnetic field $B_0$ using the gradient coils so that only nuclei within a small volume element of the patient have a Larmor frequency equal to the frequency of the r.f. field $B_1$. This means that the F.D.I.). signal comes only from nuclei within that volume element of the patient. In practice the gradient coils are supplied with time-varying electrical currents from a power supply, such as a power amplifier, so that the volume element in which the nuclei have a Larmor frequency equal to the frequency of the applied r.f. field is scanned over the patient so as to build up a 2-D or 3-D image of the patient.

A typical prior art set of gradient coils is disclosed in, for example, "Foundations of Medical Imaging" by Z. H. Cho et al (published by Wiley International), and is shown schematically in FIG. 2. The X gradient coils are shown in FIG. 2(a). FIGS. 2(b) and 2(c) show the Y gradient coils and the Z gradient coils respectively.

It will be noted that the X gradient coils and the Y gradient coils shown in FIGS. 2(a) and 2(b) are in the form of saddle coils. In each case, two saddle coils are placed either side of the Z=0 plane.

In the prior art, the gradient coils are constructed over a tubular base. In one possible arrangement, the X gradient coils are disposed over the tubular base, the Z gradient coils are placed over the X gradient coils, and finally the Y gradient coils are placed over the Z gradient coils (although the order in which the gradient coils are provided on the former is not limited to this particular order).

As shown in FIG. 2(c), the Z gradient coils are axial coils of solenoidal form. These axial coils are wound into preformed slots in an insulating former. The former is prepared by machining grooves in a fiberglass tube. The tube is then split into four sections, which are glued to the top of the X gradient coils. The Z gradient coils are then wound in the grooves in the fiberglass former using copper wire or copper bar 42. FIG. 3(a) is a side view of such a prior art former 40 showing the grooves 41, and FIG. 3(b) is an end view of the former of FIG. 3(a).

To reduce the noise created by the Z gradient coils when they are energised, the grooves 41 in the former 40 are lined with a rubber sheet 43, as shown in FIG. 4 which is an enlarged partial sectional view of the former of FIG. 3(a).

The rubber sheet 43 acts as a shock absorber and damps the vibration of the Z gradient coils thereby reducing the maximum acceleration of the coils and the noise generated by the coils in use (the vibrations are caused by the coils moving as a result of the magnetic forces acting on the coils).

It can therefore be seen that the prior art method of constructing the Z gradient coil is expensive. In particular, the construction of finely machined thin-walled glass-fiber tubes further cut into four sections is very costly. Moreover, two winding steps are required after the former has been glued in position: firstly the grooves are lined with the rubber sheet 43 and then, secondly, the copper wire or bar is wound into the rubber-lined grooves.

SUMMARY

A first aspect of the present invention provides a method of manufacturing a coil for a magnet comprising: providing a curved former; and disposing an electrical conductor around the former;

wherein the step of providing the curved former comprises the steps of:
  a) manufacturing the former in a flat or substantially flat shape; and
  b) bending the former into a curved shape.

This method of the invention allows the former to be made in one piece and then bent into position around the underlying components. Thus, the former can be made of flat molded elements, and these are much cheaper than machined ones.

In a preferred embodiment the former is manufactured from a resilient material. This eliminates the need to dispose a rubber layer on the former before winding the conductor.

A second aspect of the present invention provides a coil for a magnet, the coil comprising a resilient former and an electrical conductor disposed around the former. Use of a resilient former eliminates the need to provide a layer of rubber between the former and the conductor.

In a preferred embodiment the former is made of an elastomeric material.

The present invention also provides an MRI system comprising a coil as defined above. In a preferred embodiment the magnet constitutes a gradient coil of the MRI system.

The present invention also provides a method of manufacturing a coil for a magnet comprising the step of disposing an electrical conductor around a resilient former.

BRIEF DESCRIPTION OF THE DRAWINGS

Preferred embodiments of the present invention will now be described with reference to the accompanying drawings in which

FIGS. 2(*a*), 2(*b*) and 2(*c*) are schematic views of a prior art set of X, Y and Z gradient coils;

FIG. 3(*b*) is a partial sectional view of the former of FIG. 3(*a*); and

DETAILED DESCRIPTION

Figure 1:
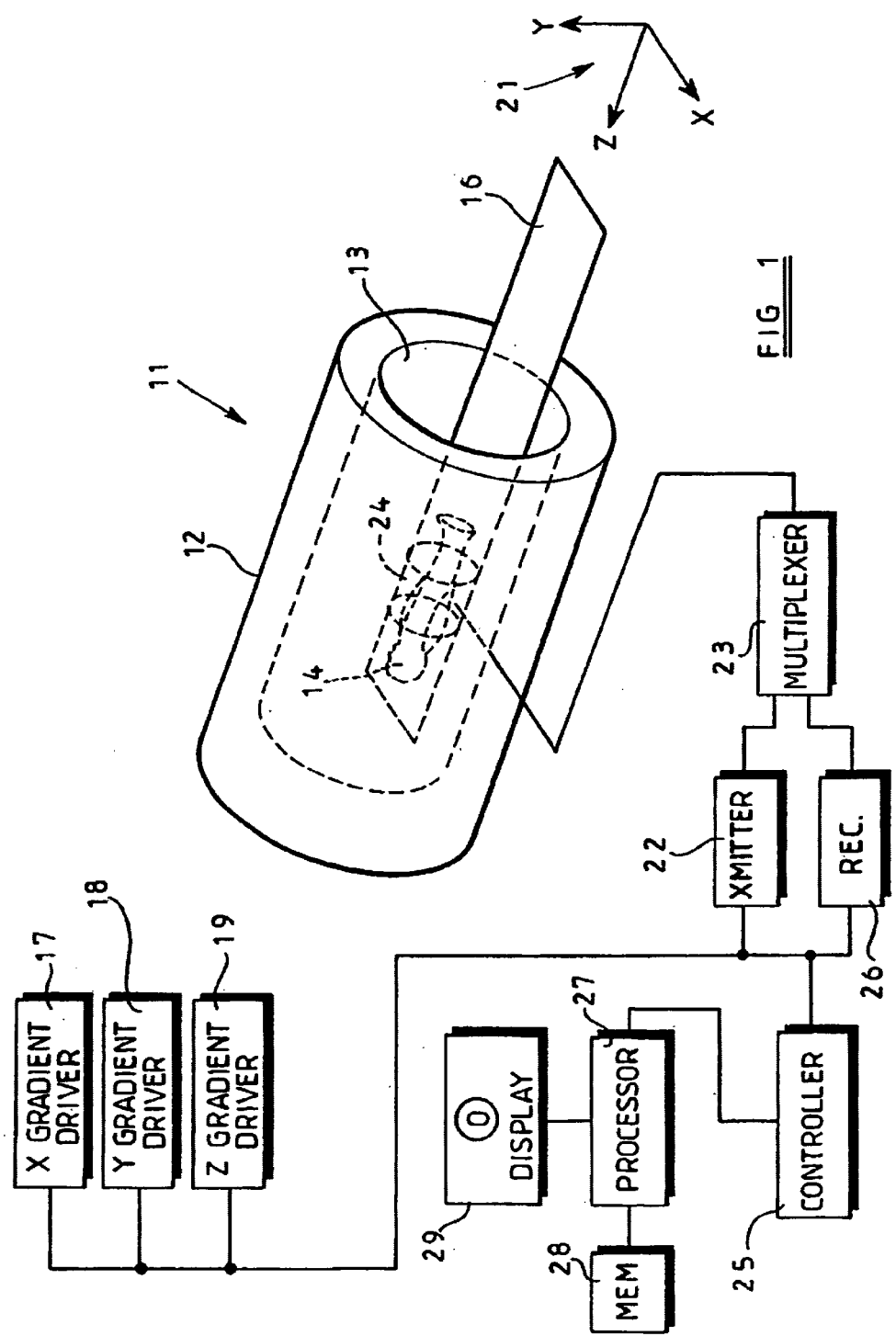
FIG. 1 is a schematic view of an MRI system.
Figure 3A:
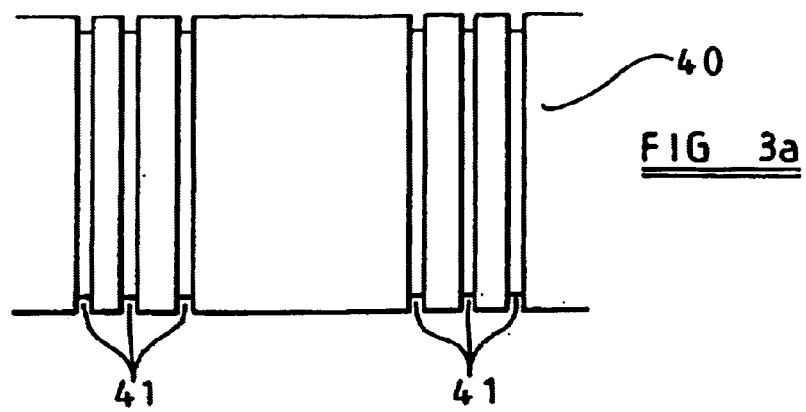
FIG. 3(*a*) is a side view of a prior art former on which the Z gradient coil is wound.
Figure 3B:
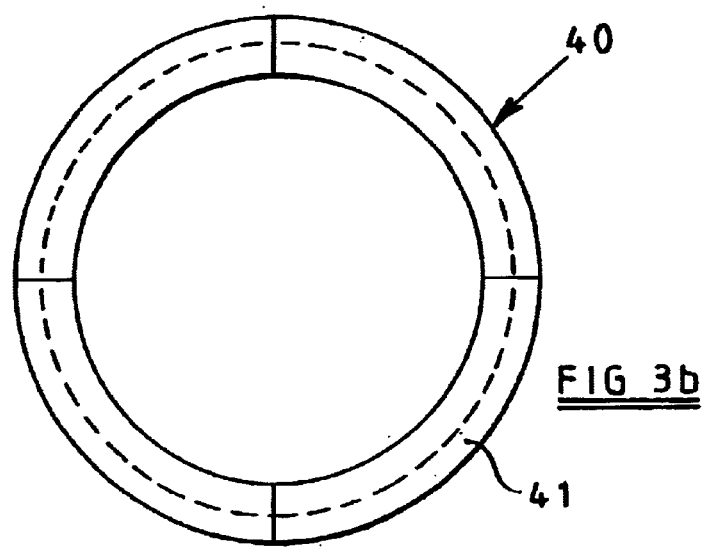
Figure 4:
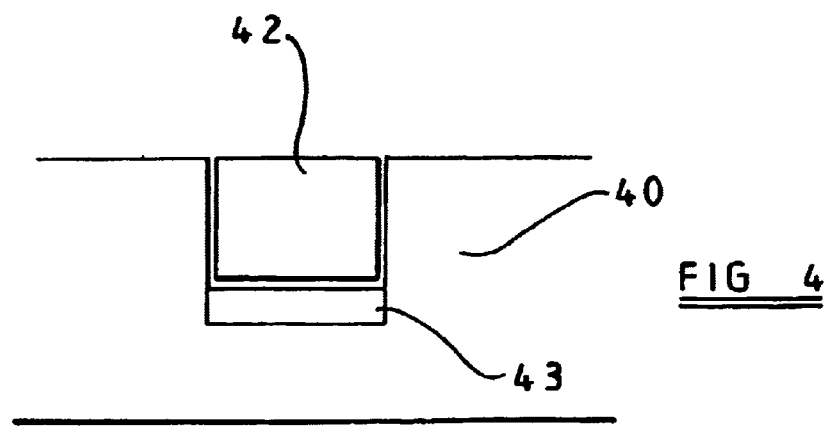
FIG. 4 is an enlarged partial view of FIG. 3(*a*).

In the present invention the former on which the Z gradient coil is wound is constructed in one piece. It is molded as a flat former, from a flexible, resilient material. The grooves in the former are formed during the molding process by using a suitably shaped mold.

Since the former is molded in a flexible material it can easily be bent into a tubular shape around the X gradient coil or other underlying component. The molded former may be secured onto the underlying component by any suitable means—for example by gluing. Once the former has been secured in place, the Z gradient coils can be wound in the grooves in the former by any conventional winding process.

Moreover, since the former is molded from a flexible, resilient material it is not necessary to line the grooves in the former with the elastic sheet 43, since the former itself will damp the vibrations of the windings. The use of an flexible, resilient former thus provides a further simplification of the manufacture of the coil.

The former can be made from any resilient, electrically insulating material that is sufficiently flexible to be bent into a tube around the X gradient coils or other underlying component (which will typically have a radius of 600–800 mm). An example of a suitable material would be an elastomeric material, for example such as a rubber or flexible epoxy resin system.

Although the former is made of a flexible, resilient material in a preferred embodiment of the invention, the invention is not limited to this. For example, it would be possible to use a former made in two or more curved parts, as in the conventional method, but manufactured from a resilient material. Using such a former would allow the step of lining the grooves with elastic to be eliminated thus simplifying the manufacture of the magnet to some extent. However, the step of aligning the constituent parts of the former would not be eliminated if this former were used.

Conversely, the former could be molded as a flat former, but using a material which was not sufficiently resilient to absorb all the vibrations of the electrical conductors. Once this former had been bent around the X gradient coil or other underlying component and secured in place it would be necessary to line the former with rubber before winding the electrical conductor. While this would not achieve the full advantage of using a flexible, resilient former it would nevertheless have some advantage over the conventional method, since it would eliminate the steps of dividing the former into four parts and positioning them individually on the X gradient coil or other underlying component.

Although the present invention has been described with reference to the Z gradient coils of a magnet for an MRI system, the invention is not limited to this. On the contrary, the present invention can be applied to any magnetic device which comprises an electrical conductor wound around a former such as a superconductive or resistive coil of an MRI magnet for producing the principal ($B_0$) magnetic field.

What is claimed is:

1. A method of manufacturing a coil for a magnet, the method comprising the steps of, in sequence:
  a) manufacturing a former in a flat or substantially flat shape to form a flat shape former;
  b) bending the flat shape former into a curved shape to form a curved former; and
  c) winding at least one electrical conductor around the curved former formed in step (b);
  wherein the flat or substantially flat former is formed by moulding.

2. A method of manufacturing a coil for a magnet, the method comprising the steps of, in sequence:
  a) manufacturing a former in a flat or substantially flat shape to form a flat shape former;
  b) bending the flat shape former into a curved shape to form a curved former; and c) disposing at least one electrical conductor around the curved former formed in step (b);

wherein the flat or substantially flat former is formed by moulding;

wherein the step of moulding the former includes moulding a groove in the former; and wherein the step of disposing the at least one conductor around the curved former comprises winding the at least one conductor into the groove.

3. A method of manufacturing a coil for a magnet, the method comprising the steps of, in sequence:

a) manufacturing a former in a flat or substantially flat shape to form a flat shape former;

b) bending the flat shape former into a curved shape to form a curved former; and c) winding at least one electrical conductor around the curved former formed in step (b);

wherein the former is manufactured from a flexible, resilient material and the flat or substantially flat former is formed by moulding.

4. The method as claimed in claim 3, further comprising a step of securing the former after the step of bending the former.

* * * * *